(12) United States Patent
Dietmar et al.

(10) Patent No.: US 10,375,848 B2
(45) Date of Patent: Aug. 6, 2019

(54) SENSOR HOUSING FOR A RADAR SENSOR AND RADAR SENSOR

(71) Applicant: Hella KGaA Hueck & Co., Lippstadt (DE)

(72) Inventors: Philipp Dietmar, Erwitte (DE); Christian Sievers, Lippstadt (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 15/566,293

(22) PCT Filed: May 3, 2016

(86) PCT No.: PCT/EP2016/059862
§ 371 (c)(1),
(2) Date: Oct. 13, 2017

(87) PCT Pub. No.: WO2016/184679
PCT Pub. Date: Nov. 24, 2016

(65) Prior Publication Data
US 2018/0359875 A1    Dec. 13, 2018

(30) Foreign Application Priority Data
May 15, 2015   (DE) .................. 10 2015 107 645

(51) Int. Cl.
| | |
|---|---|
| *H05K 7/14* | (2006.01) |
| *G01S 13/93* | (2006.01) |
| *G01S 7/03* | (2006.01) |
| *H05K 5/02* | (2006.01) |
| *H05K 5/00* | (2006.01) |

(Continued)

(52) U.S. Cl.
CPC ............ *H05K 7/1427* (2013.01); *G01S 7/02* (2013.01); *G01S 7/03* (2013.01); *G01S 13/931* (2013.01); *H01R 12/585* (2013.01); *H01R 13/6683* (2013.01); *H05K 5/0039* (2013.01); *H05K 5/0069* (2013.01); *H05K 5/0213* (2013.01); *H05K 7/1418* (2013.01); *G01S 2007/027* (2013.01); *G01S 2013/9332* (2013.01); *H01R 12/58* (2013.01); *H01R 13/6658* (2013.01);
(Continued)

(58) Field of Classification Search
CPC . H05K 7/1427; H01R 12/585; H01R 13/6683
See application file for complete search history.

(56) References Cited

U.S. PATENT DOCUMENTS

| | | |
|---|---|---|
| 5,685,729 A | 11/1997 | Reider et al. |
| 7,438,576 B2 | 10/2008 | Sakakura |

(Continued)

FOREIGN PATENT DOCUMENTS

| | | |
|---|---|---|
| DE | 3840678 C1 | 2/1990 |
| DE | 19904303 A1 | 8/2000 |

(Continued)

*Primary Examiner* — William H. Mayo, III
*Assistant Examiner* — Hiram E Gonzalez
(74) *Attorney, Agent, or Firm* — Husch Blackwell LLP

(57) ABSTRACT

A sensor housing for a radar sensor for a vehicle comprising a housing and a printed circuit board. The housing has a venting duct for the venting of the sensor housing, as well as a press-fit guide for the reception of a positioning aid for the printed circuit board. The venting duct and the press-fit guide form a common duct.

8 Claims, 3 Drawing Sheets

(51) Int. Cl.
*H01R 12/58* (2011.01)
*H01R 13/66* (2006.01)
*G01S 7/02* (2006.01)
*H01R 13/74* (2006.01)

(52) U.S. Cl.
CPC ........ *H01R 13/748* (2013.01); *H01R 2201/26* (2013.01)

(56) References Cited

U.S. PATENT DOCUMENTS

| | | |
|---|---|---|
| 9,293,870 B1 * | 3/2016 | Koczwara ............ H05K 5/0069 |
| 9,992,886 B2 * | 6/2018 | Nishida ................ H05K 5/0069 |
| 2012/0094523 A1 | 4/2012 | Hashimoto et al. |

FOREIGN PATENT DOCUMENTS

| | | |
|---|---|---|
| DE | 19946825 C1 | 2/2001 |
| DE | 10228948 A1 | 1/2004 |
| DE | 10322840 A1 | 12/2004 |
| DE | 102005043033 B3 | 4/2007 |
| DE | 102006001290 B3 | 5/2007 |
| DE | 102007042173 A1 | 3/2009 |
| DE | 102010042254 A1 | 1/2012 |
| DE | 102011052363 A1 | 2/2013 |
| DE | 112013004625 T5 | 6/2015 |
| DE | 102014105271 A1 | 10/2015 |
| DE | 102014106840 A1 | 11/2015 |
| EP | 2702641 B1 | 3/2015 |
| JP | 2001042025 A | 2/2001 |
| JP | 2005228554 A | 8/2005 |

\* cited by examiner

SENSOR HOUSING FOR A RADAR SENSOR AND RADAR SENSOR

CROSS REFERENCE

This application claims priority to PCT Patent Application No. PCT/EP2016/059862, filed 3 May 2016, which itself claims priority to German Application No. 10 2015 107645.4, filed 15 May 2015, the entirety of both of which are hereby incorporated by reference.

FIELD OF THE INVENTION

The invention relates to a sensor housing for a radar sensor for a vehicle. Furthermore, the invention relates to a radar sensor with the sensor housing.

BACKGROUND OF THE INVENTION

The sensor housings for vehicle radar sensors known from the prior art have a connector and a printed circuit board. Herein, the connector has a venting duct for the venting of the sensor housing on one hand and a press-fit guide for the reception of a positioning aid for the printed circuit board.

The disadvantage of the prior art is that a multitude of manufacturing steps is required for the production of a sensor housing until the sensor housing can be used.

SUMMARY OF THE INVENTION

It is, therefore, the task of the present invention to provide a connector which can be mounted in a space-saving manner and which can be produced in a simple and inexpensive manner.

According to the invention, the task is solved in particular by means of a sensor housing for a radar sensor for a vehicle comprising a connector and a printed circuit board, wherein the connector has a venting duct for the venting of the sensor housing and a press-fit guide for the reception of a positioning aid for the printed circuit board, wherein the venting duct and the press-fit guide form a common duct.

Furthermore, the task is solved according to the invention in particular by a radar sensor for a vehicle comprising a sensor housing.

The particular advantage of the invention is that by combining the venting duct and the press-fit guide, the space requirements for a possible sealing area and for the placement of electronic components are minimized.

Advantageously, a positioning structure such as one or more press-fit pins can be led through openings in the printed circuit board. Particularly advantageously the positioning structures engage in respective recesses arranged in the connector. Advantageously the positioning structures are introduced as soon as the printed circuit board is positioned by means of the positioning structures.

Preferably a component holder is placed between the connector and the printed circuit board. Preferably the printed circuit board can be fastened on the component holder by means of the positioning structures.

Preferentially the venting duct serves venting. Preferably a common duct is a continuous duct combining the venting duct and the press-fit guide.

Preferentially the printed circuit board (PCB) is a carrier for electronic components. It serves the mechanical fastening and the electrical connection.

Preferably printed circuit boards are made from an electrically insulating material with adhering conductive connections (PCB tracks). Preferably, fiber-reinforced plastic material is common as an insulating material. The PCB tracks are preferably etched from a thin copper layer. The components can be soldered on solder pads or solder lands. By this means they are at the same time mechanically held and electrically connected on these footprints. Preferably larger components are also fastened on the printed circuit board with cable ties, adhesive or by means of screw-fastening.

According to a further development of the invention, the duct ends with one of his ends in a connector housing of the sensor housing. The venting of the sensor housing can be achieved by this means.

According to a further development of the invention, the connector with the duct is embodied as an injection-molded part. By providing an injection-molded part, the connector with the continuous duct can be produced in a simple manner.

According to a further development of the invention, the duct is embodied as a drill hole in the connector. By this means, the duct can be introduced into the connector in a simple manner. Preferably, the drill hole is introduced into the connector by means of a drilling process.

According to a further development of the invention, the duct is embodied in a tube-shaped manner. Preferably, the tube-shaped duct has a variable diameter. According to a further development of the invention, the duct has a bend. By providing the bend, the press-fit guide and the venting duct can be connected in a simple manner.

According to a further development of the invention, the press-fit guide is oriented in an approximately vertical manner relative to the venting duct in the sensor housing. Preferably, the venting duct is inclined relative to the press-fit guide by an angle of 85° to 95°. Particularly preferably, the venting duct is inclined by 90° relative to the press-fit guide.

Preferentially, the radar sensor is embodied as a lane change assistant on the basis of a 24 GHz-radar sensor system. Preferably it is equipped to observe the rear permanently and warns the driver during take-over or lane change processes of vehicles approaching from the rear on the neighboring lane. Lane changes result in an increased risk of accidents, particularly due to the so-called blind spot. The lane change assistant observes this "blind spot" and warns the driver of risky lane changes. Preferably, the sensors of the lane change assistant are equipped to detect for example fast-driving motorcyclists to prevent accidents.

Preferably, the radar sensor is embodied as a "vehicle interval warning system" on the basis of a 24-GHz-radar sensor system which warns the driver when the allowed safety distance is exceeded, but does not intervene autonomously in the drive train. Preferentially, the radar sensor is embodied as a 3-function-camera comprising lane and traffic sign recognition as well as an adaptive/dazzle-free high beam function. In the lane keep assistant function, the vehicle is moved back to the middle of the lane as soon as the driver comes too close to the lane marking.

BRIEF DESCRIPTION OF THE DRAWINGS

Reference is now made more particularly to the drawings, which illustrate the best presently known mode of carrying out the invention and wherein similar reference characters indicate the same parts throughout the views.

FIG. 1b is a further schematic view of the connector of FIG. 1a.

FIG. 2a is a schematic section through a first partial area of a sensor housing with the connector of FIG. 1a.

FIG. 2b is a schematic section through a second partial area of the sensor housing with the connector of FIG. 1a.

DETAILED DESCRIPTION OF THE DRAWINGS

Figure 1A:
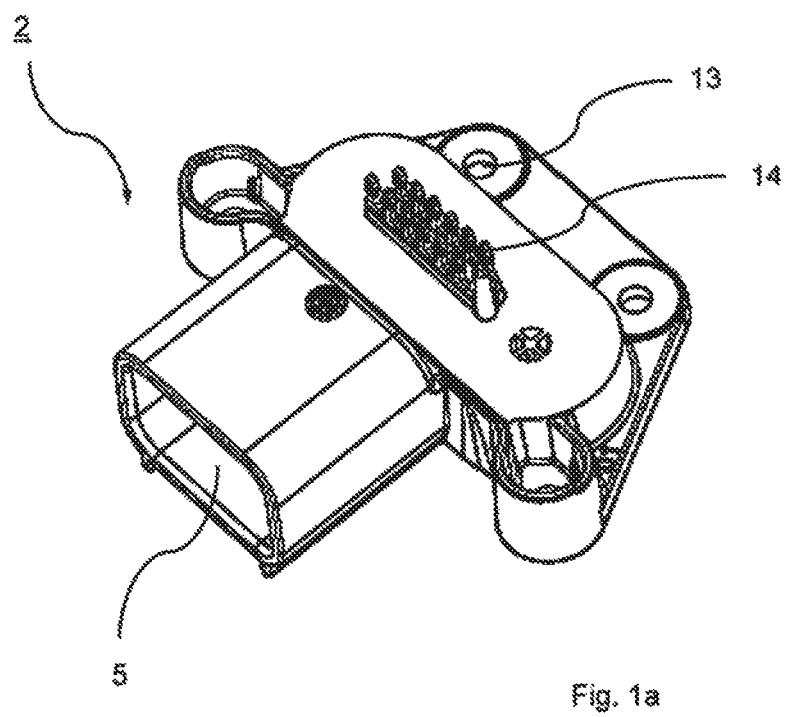
FIG. 1a is a schematic view of a connector for a radar sensor.
Figure 1B:
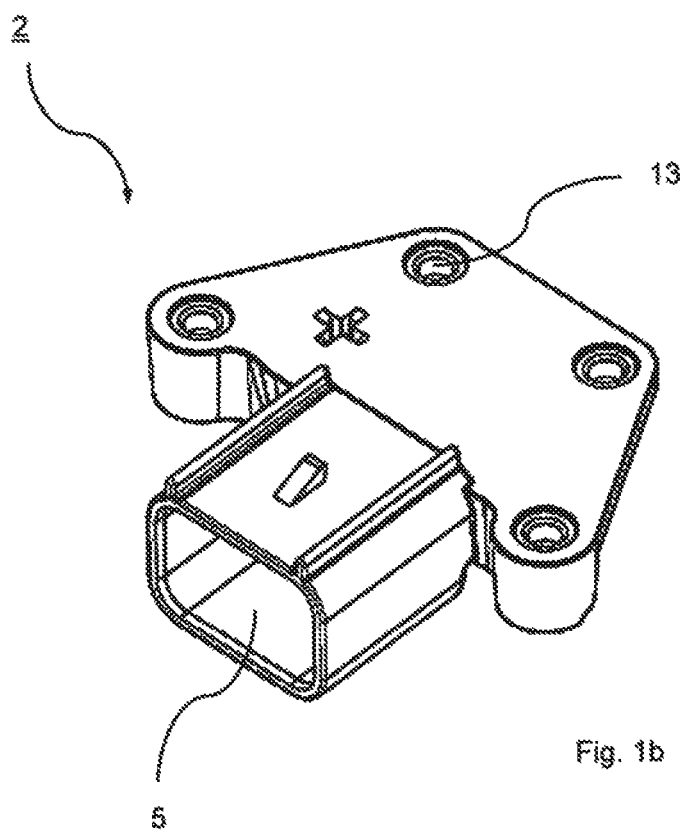

FIG. 1a shows a schematic view of a connector for a radar sensor and FIG. 1b shows a further schematic view of the connector of FIG. 1a.

The connector 2 has a connector housing 5. The connector 2 is suitable for the reception of a mating connector (not represented) fitting the connector housing. Furthermore, four drill holes 13 are provided in the connector 2 to allow the fastening of the connector 2. Furthermore, the connector 2 has a contact connection 14 to be connected with a radar sensor (not represented).

Figure 2A:
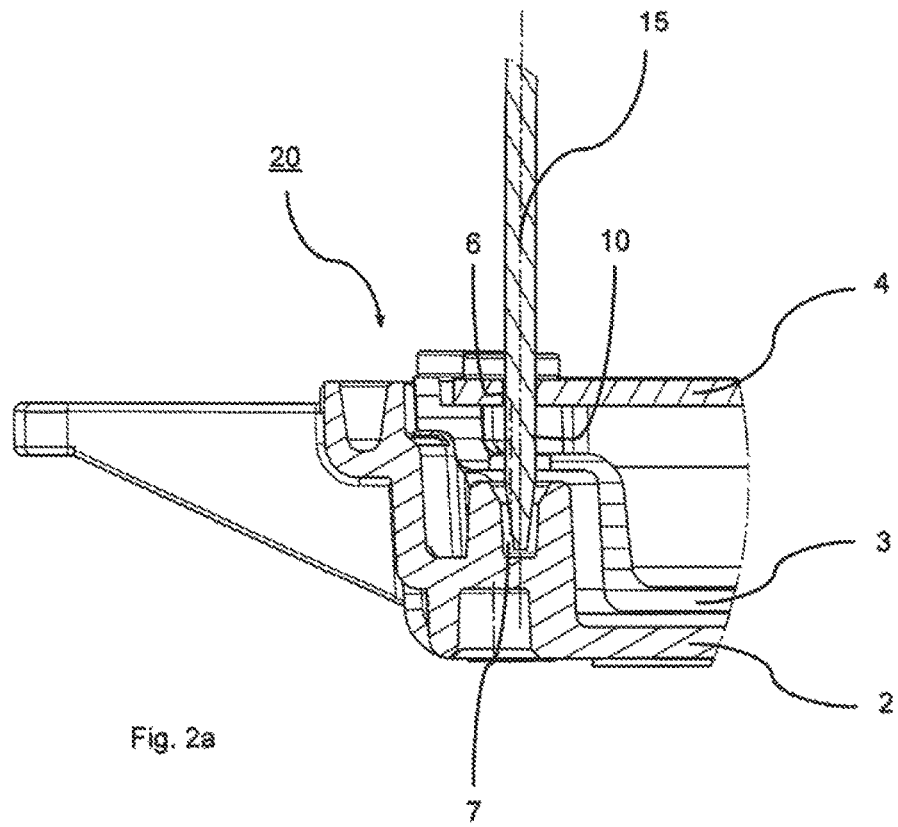

FIG. 2a shows a schematic section through a first partial area of a sensor housing with the connector of FIG. 1a.

The sensor housing 20 comprises the connector 2, a component carrier 3 and a printed circuit board 4. The component carrier 3 is arranged between the connector 2 and the printed circuit board 4. The connector 2 has a press-fit guide 10 for the reception of a positioning aid 15, a metal spike, for the printed circuit board 4. To preposition the printed circuit board 4 for a pressing-in of press-in pins (not represented), the printed circuit board 4 is penetrated by the positioning aid 15. Herein, the positioning aid 15 is guided through an opening 6 in the printed circuit board 4 until the one end of the positioning aid 15 has contact with a cylinder 7 arranged on the bottom of the connector 2. On The positioning aid 15 is inserted in the drawing plane from above in a vertical direction into the sensor housing 20. This ensures that the tolerance of the printed circuit board 4 to the connector 2 is as small as possible.

Figure 2B:
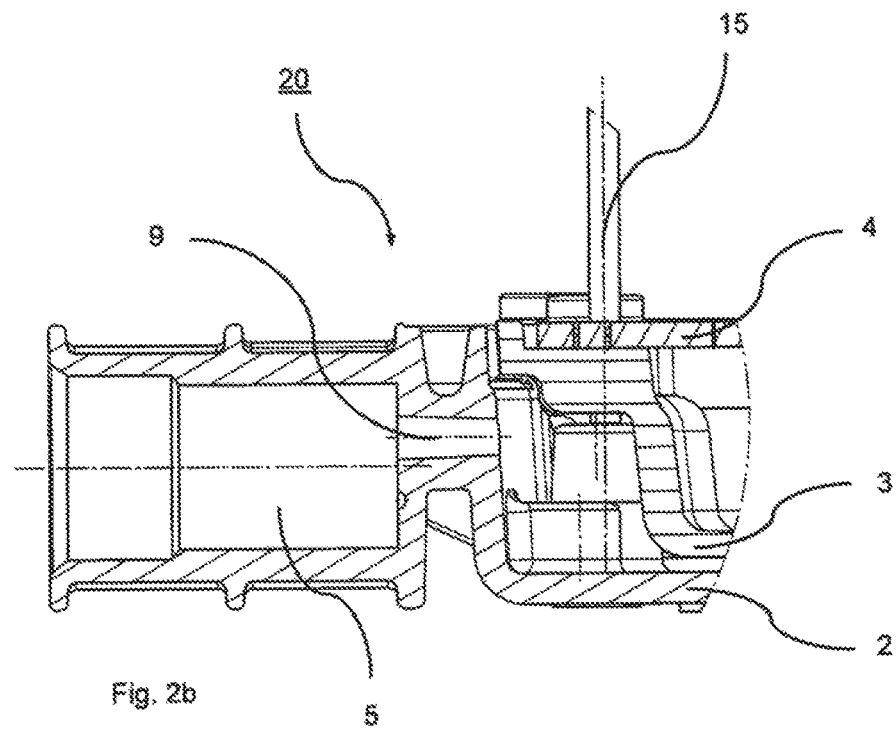

FIG. 2b is a schematic section through a second partial area of the sensor housing with the connector of FIG. 1a.

The sensor housing 20 comprises the connector 2, a component carrier 3 and a printed circuit board 4. The component carrier 4 is arranged between the connector 2 and the printed circuit board 4. Furthermore, the connector housing 5 for the reception of the mating connector part (not represented) is provided. The connector 2 has a venting duct 9 for the venting of the sensor housing 20. This ensures an easy venting of the sensor housing 20.

Figure 3:
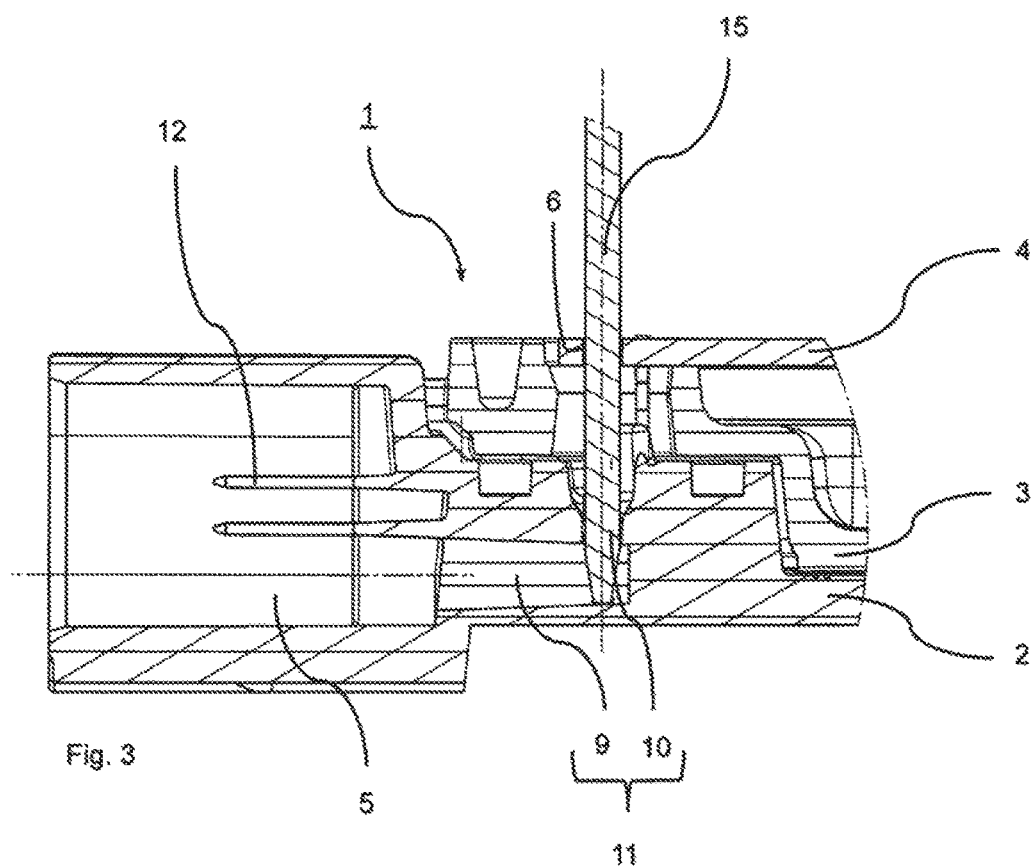
FIG. 3 is a schematic section through a part of a sensor housing for a radar sensor according to the invention.
Figure 4:
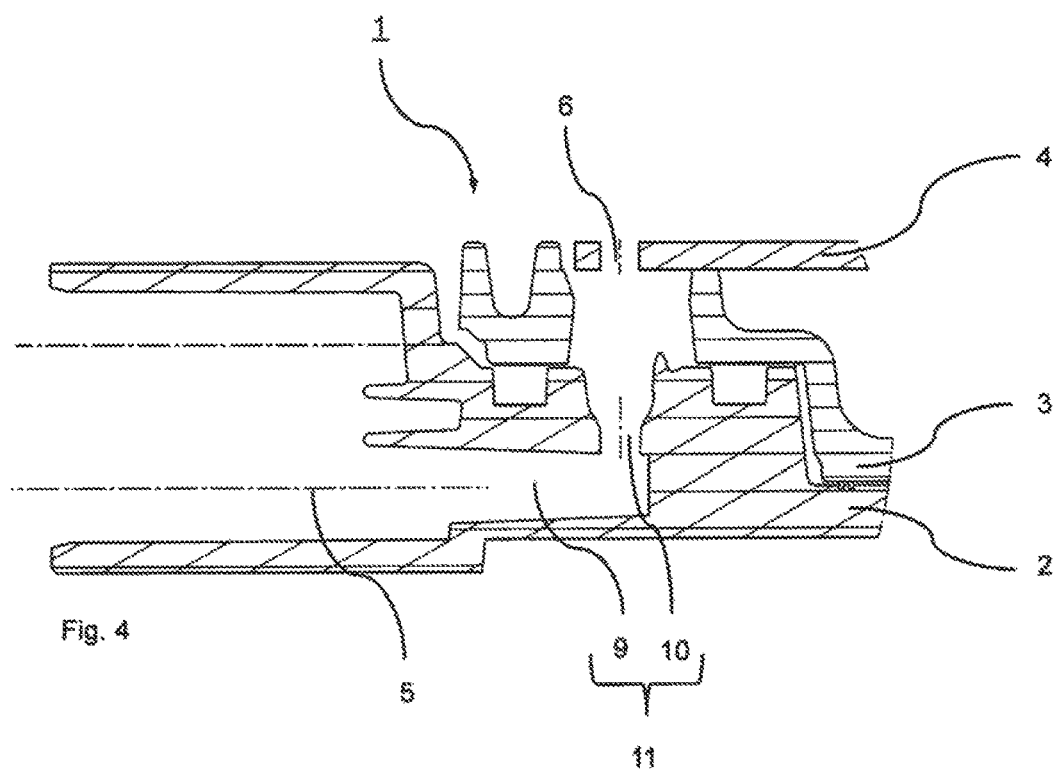
FIG. 4 is a further schematic section through a partial area of the sensor housing of FIG. 3 in a simplified representation.

FIG. 3 is a schematic section through a partial area of a sensor housing according to the invention for a radar sensor and FIG. 4 is a further schematic section through a partial area of the sensor housing of FIG. 3 in a simplified representation.

The sensor housing 1 has a connector 2, a component carrier 3, and a printed circuit board 4. The component carrier 3 is arranged between the connector 2 and the printed circuit board 4. The connector 2 has a duct 11. The duct 11 unites a venting duct 9 and a press-fit guide 10.

Herein, the press-fit guide 10 serves the reception of a positioning aid 15 for the printed circuit board 4. To preposition the printed circuit board 4 for the pressing-in of press-in pins (not represented), the printed circuit board 4 is penetrated by the positioning aid 15. Herein, the positioning aid 15 is guided through an opening 6 in the printed circuit board 4 until the one end of the metal spike has contact with the venting duct. The positioning aid 15 is inserted in the drawing plane from above in a vertical direction into the sensor housing 1. This ensures that the tolerance of the printed circuit board 4 to the connector 2 is as small as possible.

The venting duct 9 is provided for the venting of the sensor housing 1 to ensure an easy venting of the sensor housing 20. At one of its ends, the duct 11 ends in the connector housing 5 of the sensor housing 1. The duct 11 is embodied in a tube-shaped manner and has a bend. Herein, the press-fit guide 10 is arranged in an approximately vertical manner relative to the venting duct 9 in the sensor housing 1.

By providing the common duct, the combination of venting duct and press-fit guide can minimize the space requirements for a possible sealing area and for the placement of electronic components.

The above description of the embodiments describes the present invention solely on the basis of examples. If technically sensible, the individual characteristics of the embodiments can, of course, be feely combined without leaving the basis of the present invention.

LIST OF REFERENCE SIGNS

1 Sensor housing
2 Connector
3 Component carrier
4 Printed circuit board
5 Connector housing
6 Opening
7 Cylinder
8 Radar sensor
9 Venting duct
10 Press-fit guide
11 Duct
12 Plug-in connection
13 Drill hole
14 Contacting connection
15 Positioning aid
20 Sensor housing according to the prior art

The invention claimed is:

1. A sensor housing for a radar sensor for a vehicle, the sensor housing comprising:
   a connector having a venting duct for the venting of the sensor housing, and having a press-fit guide;
   a printed circuit board, wherein said press-fit guide receives a positioning structure for the printed circuit board;
   wherein the venting duct and the press-fit guide form a common duct.

2. The sensor housing according to claim 1, wherein the duct ends in a connector housing of the sensor housing with one of its ends.

3. The sensor housing according to claim 1, wherein the connector with the duct is embodied as an injection-molded part.

4. The sensor housing according to claim 1, wherein the duct is embodied as a drill hole in the connector.

5. The sensor housing according to claim 1, wherein the duct is embodied in a tube-shaped manner.

6. The sensor housing according to claim 1, wherein the duct has a bend.

7. The sensor housing according to claim 1, wherein the press-fit guide is arranged in an approximately vertical manner relative to the venting duct in the sensor housing.

8. A radar sensor for a vehicle with a sensor housing according to claim 1.

\* \* \* \* \*